United States Patent
Zhai et al.

(10) Patent No.: US 10,139,874 B2
(45) Date of Patent: Nov. 27, 2018

(54) HEAT SINK FOR USE IN STORAGE AND ASSOCIATED STORAGE

(71) Applicant: EMC IP Holding Company LLC, Hopkinton, MA (US)

(72) Inventors: Haifang Zhai, Shanghai (CN); Yujie Zhou, Shanghai (CN); Qingqiang Guo, Shanghai (CN); Hendry Xiaoping Wu, Shanghai (CN); David Dong, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/846,283

(22) Filed: Dec. 19, 2017

(65) Prior Publication Data

US 2018/0173284 A1 Jun. 21, 2018

(30) Foreign Application Priority Data

Dec. 21, 2016 (CN) .......................... 2016 1 1194035

(51) Int. Cl.
| | |
|---|---|
| *G06F 1/20* | (2006.01) |
| *G06F 1/18* | (2006.01) |
| *G11B 33/14* | (2006.01) |
| *H05K 7/20* | (2006.01) |
| *H05K 5/02* | (2006.01) |

(52) U.S. Cl.
CPC .............. *G06F 1/206* (2013.01); *G06F 1/181* (2013.01); *G06F 1/20* (2013.01); *G11B 33/142* (2013.01); *H05K 5/0213* (2013.01); *H05K 7/20145* (2013.01); *H05K 7/20154* (2013.01); *H05K 7/20181* (2013.01)

(58) Field of Classification Search
CPC ..... G06F 1/20; H05K 5/0213; H05K 7/20181
See application file for complete search history.

(56) References Cited

U.S. PATENT DOCUMENTS

| | | | |
|---|---|---|---|
| 8,405,985 B1 * | 3/2013 | Reynov .............. | H05K 7/20736 361/688 |
| 8,625,274 B2 * | 1/2014 | Lin ......................... | G06F 1/206 361/679.51 |
| 2005/0286241 A1 * | 12/2005 | Tsai ....................... | G06F 1/203 361/816 |
| 2008/0298014 A1 * | 12/2008 | Franco .................... | G06F 1/183 361/688 |
| 2009/0147464 A1 * | 6/2009 | Anderl ..................... | G06F 1/20 361/679.46 |

(Continued)

Primary Examiner — Adrian S Wilson
(74) Attorney, Agent, or Firm — Krishnendu Gupta; Konrad R. Lee

(57) ABSTRACT

The present disclosure involves a heat dissipater for a storage and the corresponding storage. The storage comprises a drawer chassis including at least one baffle arranged in a direction perpendicular to a pulling direction of the drawer chassis. The drawer chassis accommodates disks organized in a plurality of rows and placed against the corresponding baffle. The heat dissipater comprises: venting holes arranged on the baffle and corresponding to disks placed against the respective baffle; and flyers arranged on the baffle and corresponding to the venting holes respectively, the flyers being arranged to block the corresponding venting holes and to expose the corresponding venting holes in response to the attraction of the magnetic winding.

17 Claims, 6 Drawing Sheets

(56) References Cited

U.S. PATENT DOCUMENTS

| | | | | |
|---|---|---|---|---|
| 2011/0043995 A1* | 2/2011 | Chen | ........................ | G06F 1/203 361/679.55 |
| 2012/0087085 A1* | 4/2012 | Moore | .................... | G06F 1/182 361/679.46 |
| 2016/0360640 A1* | 12/2016 | Li | ........................... | H01F 7/064 |

* cited by examiner

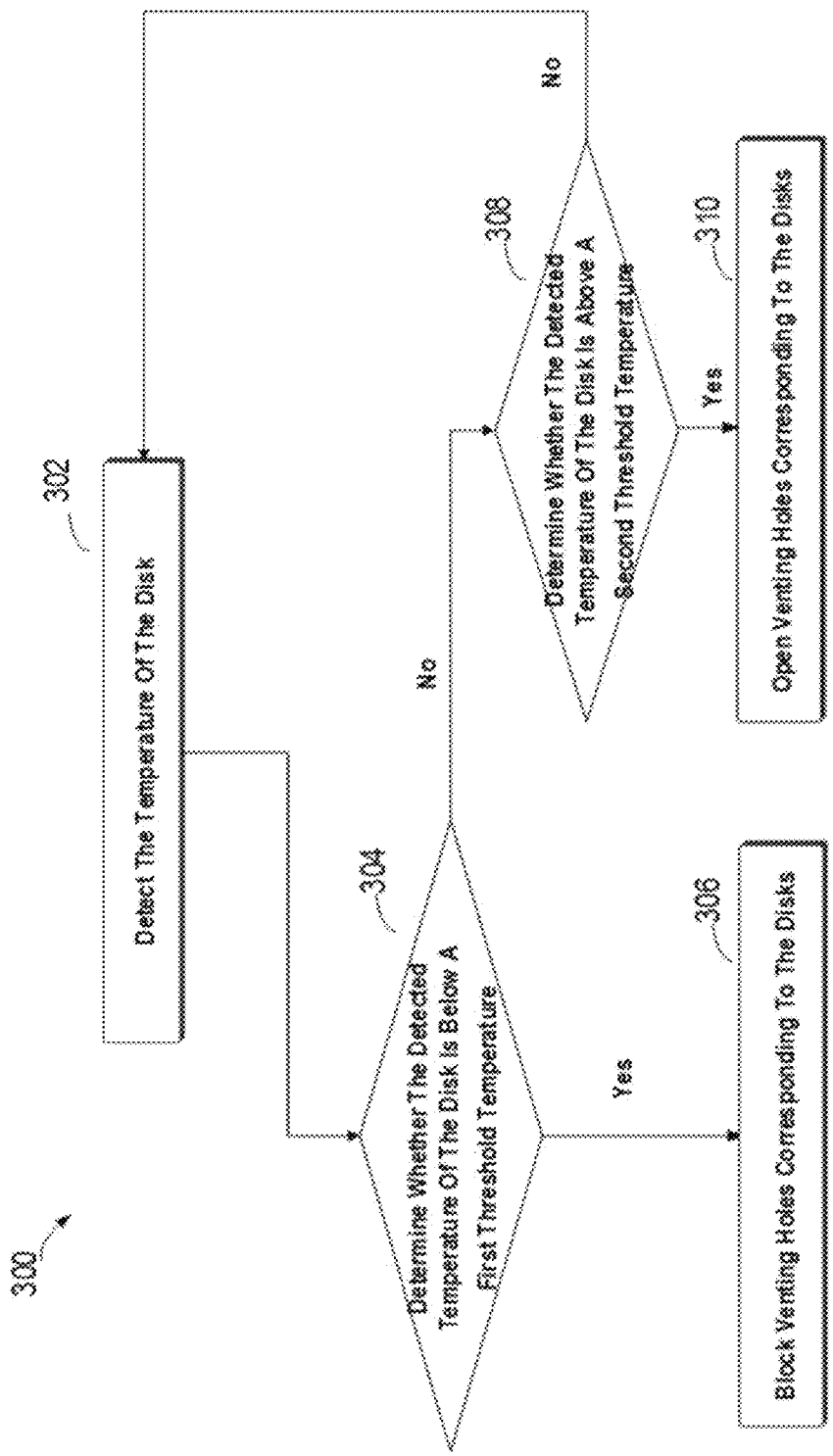

HEAT SINK FOR USE IN STORAGE AND ASSOCIATED STORAGE

RELATED APPLICATIONS

This application claim priority from Chinese Patent Application Number CN201611194035.9, filed on Dec. 21, 2016 at the State Intellectual Property Office, China, titled "HEAT SINK FOR USE IN STORAGE AND ASSOCIATED STORAGE" the contents of which is herein incorporated by reference in its entirety.

FIELD

Implementations of the present disclosure generally relate to the field of storage, and more specifically, to a heat dissipater for a storage and the corresponding storage.

BACKGROUND

In the design and utilization process of the disk array enclosure (DAE), one of the challenges is that since disks inside the enclosure (for example, including, but not limited to, magnetic disk, compact disk, hard disk and U disk and so on) are located at different positions, some disks face the risk of high temperature while some disks do not. If no measures are taken for disks facing the risk of high temperature, these disks will be definitely damaged. Therefore, it is necessary to find an economic and easy-to-implement technique that can cool the disks facing the risk of high temperature.

SUMMARY

Implementations of the present disclosure provide a heat dissipater for a storage and the corresponding storage to solve at least in part the above and other potential problems of the prior art.

In an aspect of the present disclosure, there is provided a heat dissipater for a storage. The storage includes a drawer chassis comprising at least one baffle arranged in a direction perpendicular to a pulling direction of the drawer chassis. The drawer chassis accommodates disks organized in a plurality of rows and placed against the respective baffle. The heat dissipater comprises: venting holes arranged on the at least one baffle and corresponding to the disks placed against the respective baffle, respectively; and flyers arranged on the at least one baffle and corresponding to the venting holes, respectively, the flyers being arranged to block the corresponding venting holes and to expose the corresponding venting holes in response to an attraction of the magnetic winding.

In another aspect of the present disclosure, there is provided a storage. The storage comprises: a drawer chassis comprising at least one baffle arranged in a direction perpendicular to a pulling direction of the drawer chassis. The drawer chassis accommodates disks organized in a plurality of rows and placed against the respective baffle; a fan accommodated in the drawer chassis and arranged closed to a distal end of the drawer chassis, the fan being arranged along a direction perpendicular to the pulling direction and generating a suction wind for dissipating heat for the disks; and a heat dissipater for the storage according to the aspect of the present disclosure.

In another aspect of the present disclosure, there is provided a method for controlling a heat dissipater according to the aspect of the present disclosure. The method comprises: in response to detecting that a temperature of the disks corresponding to the venting holes is below a first threshold temperature, blocking the venting holes; and in response to detecting that the temperature of the disks corresponding to the venting holes is above a second threshold temperature, exposing the venting holes.

In another aspect of the present disclosure, there is provided a computer program product being tangibly stored on a non-transitory computer storage medium and comprising computer-executable instructions which, when executed in a device, cause the device to perform the method according to another aspect of the present disclosure.

In another aspect of the present disclosure, there is provided a computer readable storage medium having computer readable program instructions stored thereon to perform the method according to another aspect of the present disclosure.

BRIEF DESCRIPTION OF THE DRAWINGS

Implementations of the present disclosure are described with reference to the accompanying drawings only by way of example, in which:

FIG. 6 illustrates a flow diagram for controlling venting holes according to the implementations of the present disclosure.

DETAILED DESCRIPTION OF EMBODIMENTS

Figure 1:
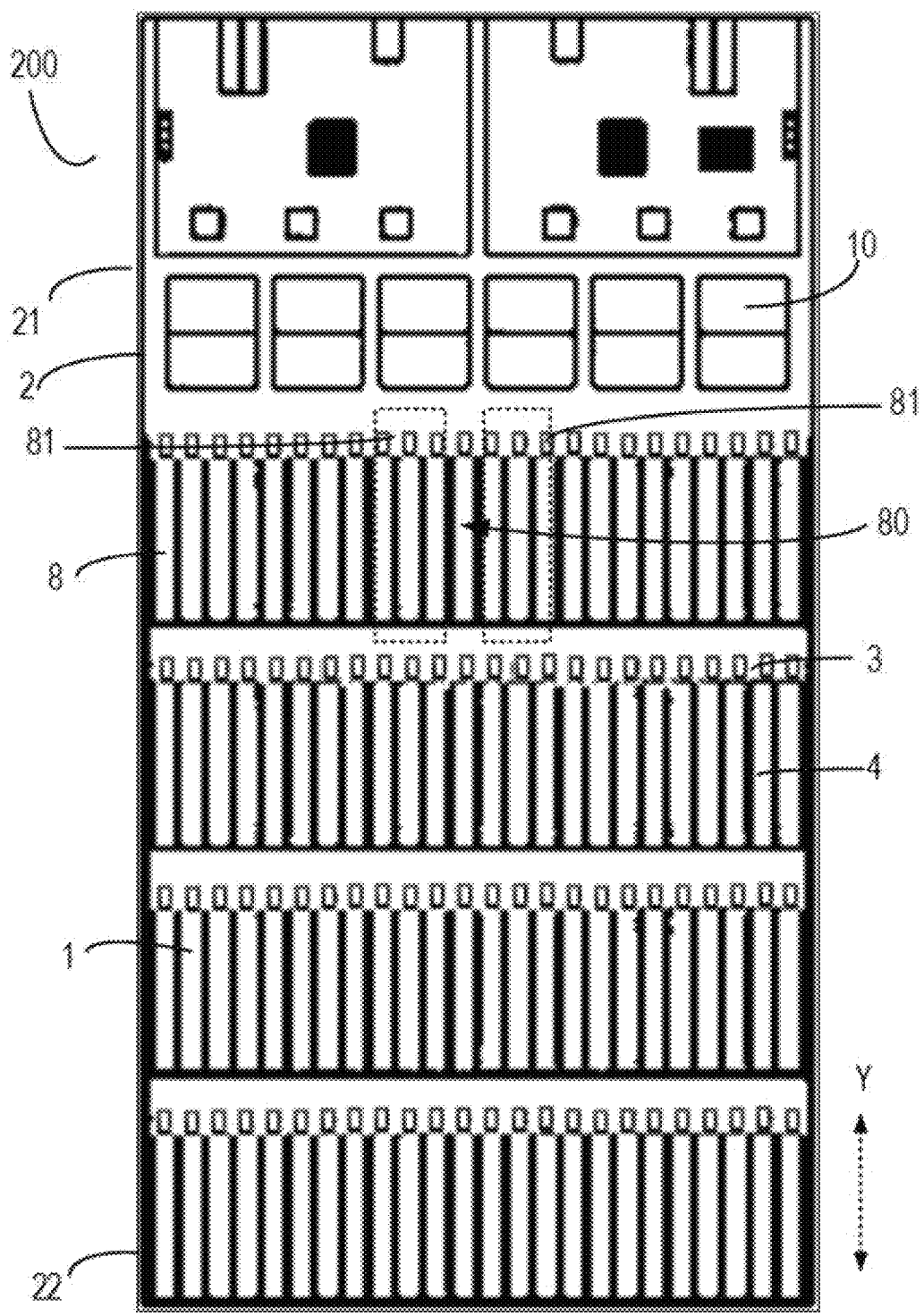
FIG. 1 illustrates a structural schematic diagram of the storage according to the implementations of the present disclosure.

Implementations of the present disclosure will be described with reference to the drawings in detail. It should be noted that similar components or function modules may be represented with the same number in the drawings. The appended drawings only intend to depict the implementations of the present disclosure. Without departing from the spirit and scope of protection of the present disclosure, those skilled in the art can obtain alternative implementations from the following depiction.

In the conventional storage, a disk is accommodated in the drawer chassis. The air flow (such as the suction wind generated by the fan in the drawer chassis), limited by the drawer chassis (for example, direction of the air flow is limited), has heat dissipating effect on the disks. However, as disks inside the enclosure (for example, including, but not limited to, magnetic disk, compact disk, hard disk and U disk and so on) are located at different positions, some disks have the risk of high temperature (bad heat dissipating effect) while some disks do not (good heat dissipating effect). If no measures are taken for disks facing the risk of high temperature, these disks will be definitely damaged.

Figure 2:
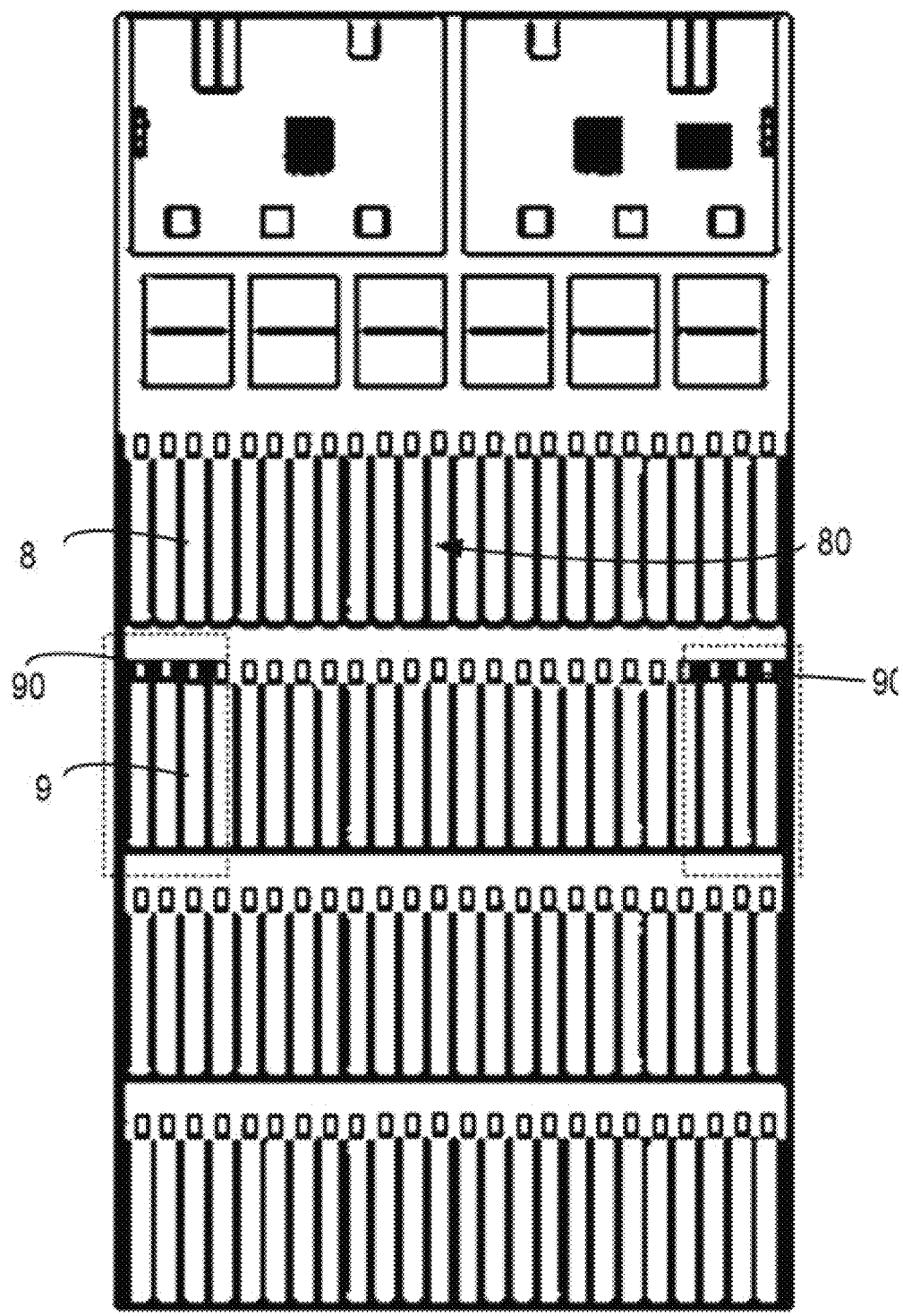
FIG. 2 illustrates a structural schematic diagram of the storage according to the implementations of the present disclosure.
Figure 3:
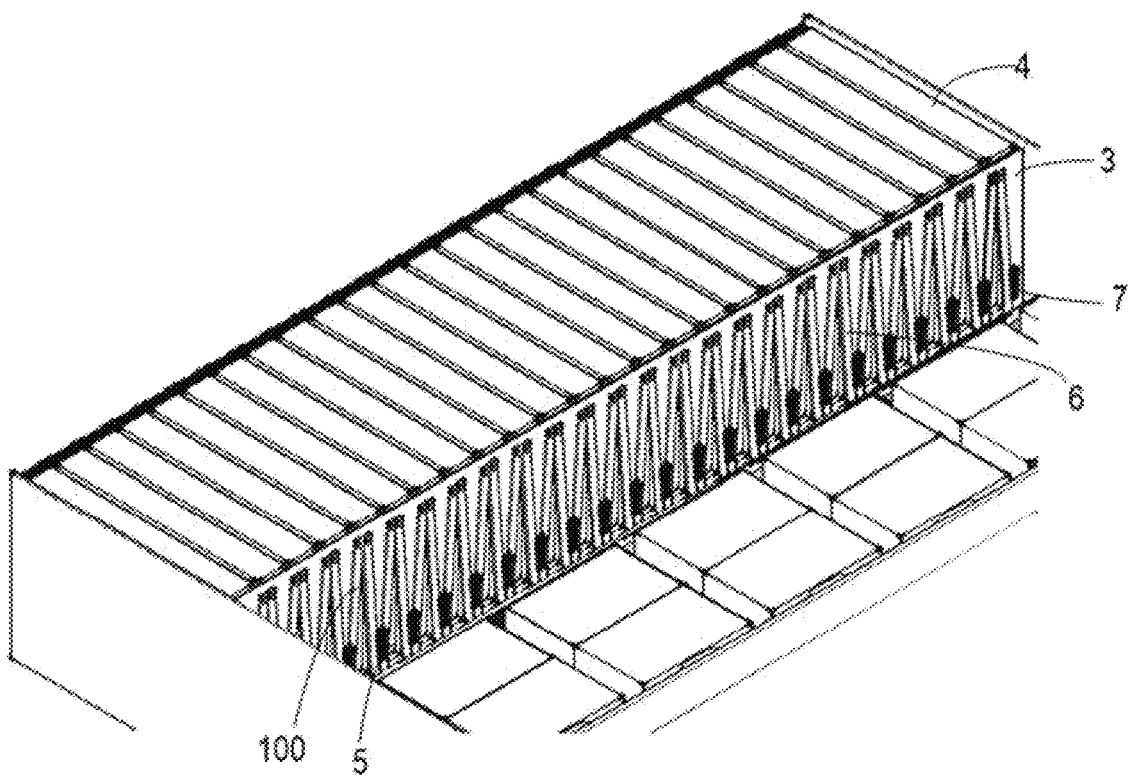
FIG. 3 illustrates a structural schematic diagram of the heat dissipater in FIGS. 1-2.

FIGS. 1-3 illustrate a schematic diagram of the storage 200 according to the implementations of the present disclosure. As shown in the figures, the storage 200 comprises: a drawer chassis 2, a fan 10 and a heat dissipater 100. The drawer chassis 2 comprises at least one baffle 3 arranged in a direction perpendicular to a pulling direction Y of the drawer chassis 2. The drawer chassis 2 is used for accommodating disks 4 which are generally organized in a plurality of rows 1 (such as forming a disk array) and placed against the respective baffle. As a rule, fan 10 is accommodated inside the drawer chassis 2 and arranged closed to a distal end 21 of the drawer chassis 2. Fan 10 is arranged along a direction perpendicular to the pulling direction Y and generates a suction wind for dissipating heat for disks 4.

For example, the distal end 21 of the drawer chassis 2 is an end of the drawer chassis 2 far from the user. For instance, the user would normally perform pulling action at the exit position (namely, proximal end 22) of the drawer chassis 2, as shown in FIG. 1.

Now, various example implementations of the heat dissipater 100 in the present disclosure will be described in detail. As shown in FIGS. 1-3, the heat dissipater 100 comprises venting holes 5 which are arranged on the baffle 3 and correspond to disks 4 placed against the respective baffle respectively. The heat dissipater 100 further includes a flyer 6 which is arranged on the baffle 3 and corresponds to the venting holes 5 respectively. The flyer 6 is arranged to block the corresponding venting holes 5 and to expose the corresponding venting holes 5 in response to the attraction of the magnetic winding 7.

As venting holes 5 corresponding to disks 4 placed against the respective baffle are arranged on baffle 3 and the corresponding flyer 6 is further arranged on venting holes 5, the corresponding venting holes 5 can be exposed in response to the attraction of the magnetic winding 7. Thus, when disks having high temperature risk are exposed to high temperature, the corresponding venting holes 5 are opened to enhance heat dissipation, thereby preventing damage to the disks.

Figure 4:
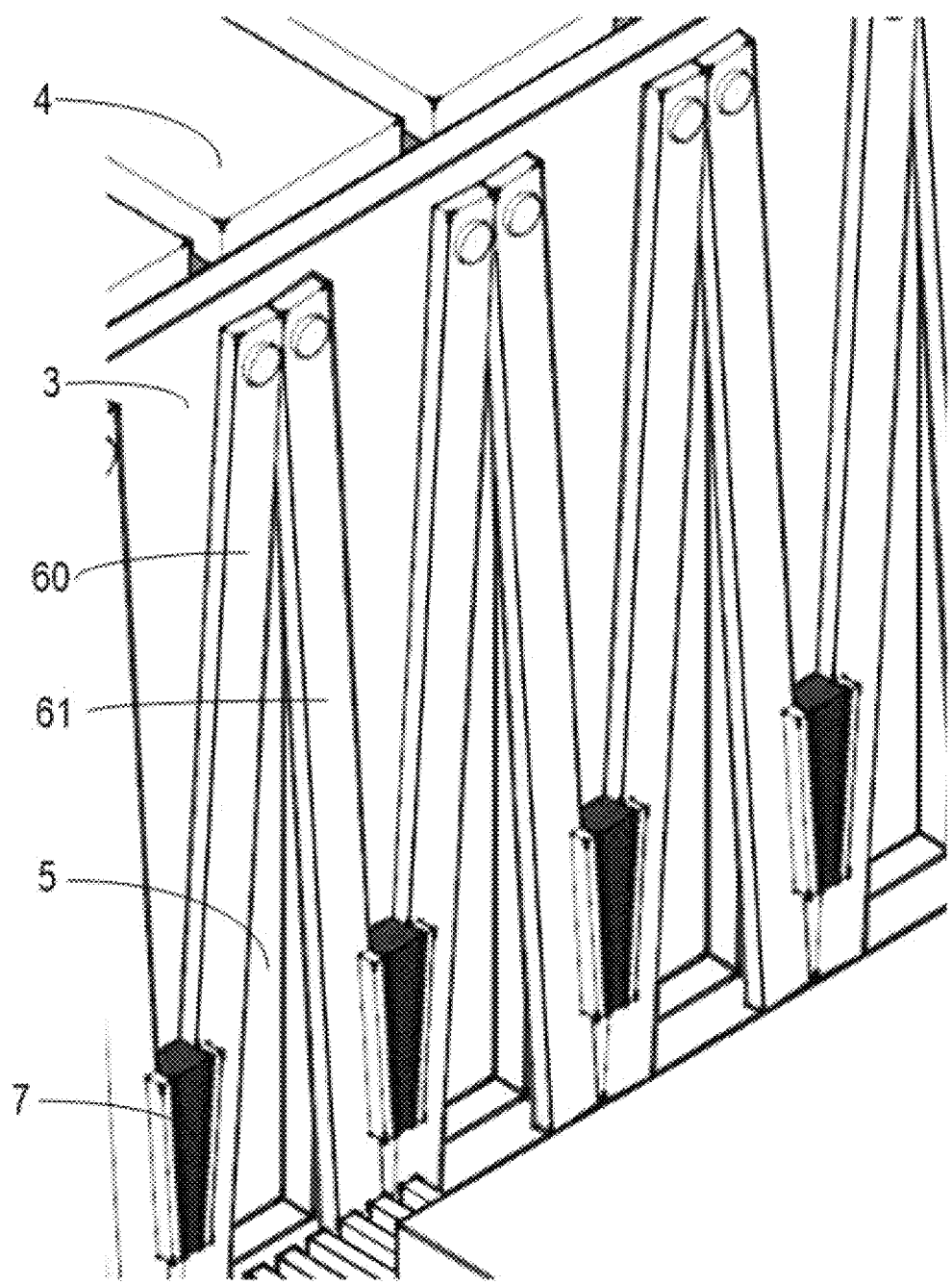
FIG. 4 illustrates a partial structural schematic diagram of the heat dissipater in FIG. 3.
Figure 5:
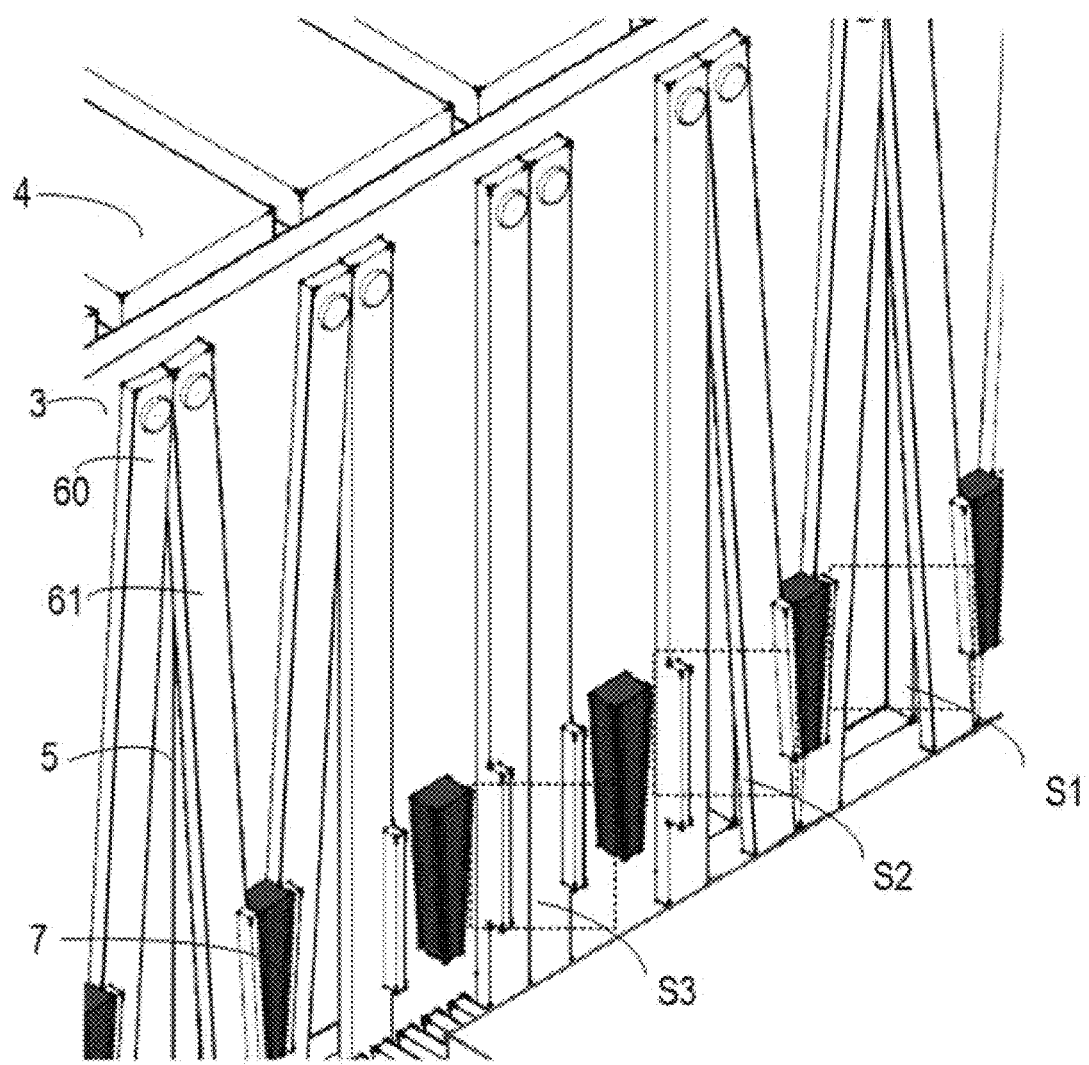
FIG. 5 illustrates a structural schematic diagram of the action of the flyer in FIG. 3.

As shown in FIGS. 4-5, according to an implementation of the present disclosure, venting holes 5 are rectangular holes arranged on the baffle 3 with length and width respectively below those of the sides of the disks 4. In other words, the profiles of venting holes 5 are located within side profiles of the disks 4. In this implementation, venting holes 5 are rectangular holes to facilitate manufacturing and processing, and their length and width are equal to or smaller than the length and width of the sides of disks 4 in order to dissipate heat specifically for the corresponding disks 4 without affecting adjacent disks 4, hence achieving better heat dissipating effect.

As shown in FIGS. 4-5, according to an implementation of the present disclosure, each of the flyers 6 has a first end moveably mounted on the respective baffle 3 and a second free end. In such an implementation, one end of the flyer 6 can be mounted moveably to the baffle 3 and the other end is arranged as a free end which can rotate around one end of the baffle 3. As a result, for instance, since the flyer 6 as a whole can move due to the attraction or release by the magnetic winding 7, function of blocking or exposing venting holes 5 can be achieved.

As shown in FIG. 5, according to an implementation of the present disclosure, the magnetic winding 7 is arranged to attract flyers 6 located on two opposite sides of the magnetic winding 7. In such an implementation, the magnetic winding 7, when conducted with power, would attract flyers 6 at two opposite sides of the magnetic winding 7 so as to expose the corresponding venting holes 5. By controlling power conduction of the magnetic winding 7, the venting holes 5 can be controlled as working, for instance, in the first state S1, the second state S2 or the third state S3.

As shown in FIG. 5, according to an implementation of the present disclosure, flyers 6 comprise a first flyer 60 and a second flyer 61 parallel to each other, each of the first flyer 60 and the second flyer 61 being of a long strip form. In such an implementation, both the first flyer 60 and the second flyer 61 are of a long strip form, so that the flyer 6 as a whole assumes the form of long strip whose size can be arranged to partly or fully cover the corresponding venting holes in case that the first flyer 60 and the second flyer 61 are folded.

As shown in FIG. 5, according to an implementation of the present disclosure, the first flyer 60 and the second flyer 61 cover at least a part of the corresponding venting holes 5 in case that the first flyer 60 and the second flyer 61 are folded. In such an implementation, the first flyer 60 and the second flyer 61 in the folded state at least partly cover the corresponding venting holes 5, so as to have an impact on the heat dissipating effect of the disks 4 corresponding to the venting holes 5. For instance, when the temperature of disks 4 is high (for example, above 65° C.), venting holes 5 are exposed; when the temperature of disks 4 is low (for instance, below 65° C.), venting holes 5 are blocked. For instance, when the temperature of disks 4 is low, the first flyer 60 and the second flyer 61 can cover venting holes 5 at least in part under the effect of gravity so as to conserve energy (for instance, magnetic winding 7 can be cut off power supply to save power). It should be noted that the numeric value described herein (for instance, 65° C.) is only exemplary with no intent to limit the scope of the present disclosure in any manner.

As shown in FIG. 5, according to an implementation of the present disclosure, the first flyer 60 and the second flyer 61 completely cover and block the venting holes 5 in case that the first flyer 60 and the second flyer 61 are folded. In such an implementation, the first flyer 60 and the second flyer 61 in the folded state cover the corresponding venting holes 5 completely, so as to have an impact on the heat dissipating effect of the disks 4 corresponding to venting holes 5. For instance, when the temperature of disks 4 is high (for example, higher than or equal to 65° C.), venting holes 5 are exposed; when the temperature of disks 4 is low (for instance, lower than 65° C.), venting holes 5 are blocked. For instance, when the temperature of disks 4 is low, the first flyer 60 and the second flyer 61 can cover venting holes 5 completely under the effect of gravity so as to conserve energy (for instance, magnetic winding 7 can be cut off power supply to save power).

As shown in FIG. 5, according to an implementation of the present disclosure, a controller (not shown) is included which is arranged to enable at least one of the venting holes 5 to switch among the following states: a first state S1, during which the first flyer 60 and the second flyer 61 are attracted by the magnetic winding 7 simultaneously so that the venting holes 5 are in the completely exposed state (namely, the venting holes 5 are completely exposed); a second state S2, during which the first flyer 60 or the second flyer 61 is attracted by the magnetic winding 7 so that the venting holes 5 are in a partially exposed state (namely, a part of venting holes 5 is exposed); and a third state S3, during which the first flyer 60 and the second flyer 61 are not attracted by the magnetic winding 7 so that the venting holes 5 are in a blocked state (namely, venting holes 5 are completely blocked).

In such an implementation, the venting holes 5 in the first state S1 are in a completely exposed state, the venting holes 5 in the second state S2 are in a partially exposed state and in the third state S3 in a blocked state. By switching these states, the wind volume of venting holes 5 can be adjusted so as to impact the heat dissipating effect of disks 4 corresponding to the venting holes 5. For instance, depending on the detected temperature of disks 4, the state in which the venting holes 5 are located can be controlled, for example, when the temperature is high (such as above 65° C.), controlling the venting holes 5 in the first state S1; when the temperature is medium (such as between 55° C. and 65° C.), controlling the venting holes 5 in the second state S2; and when the temperature is low (below 55° C.), controlling the venting holes 5 in the third state S3.

According to an implementation of the present disclosure, a controller (not shown) is included which is arranged to: in response to detecting that a temperature of disks 4 corresponding to the venting holes 5 is below a first threshold temperature, block venting holes 5 corresponding to disks 4. On the other hand, the controller can be arranged to: in response to detecting that the temperature of disks 4 corresponding to venting holes 5 is above a second threshold temperature, expose venting holes 5 corresponding to disks 4. In such an implementation, for example, the temperature of disks 4 can be detected and the corresponding venting holes 5 can be controlled based on the detected temperature to impact the heat dissipating effect of disks 4. For instance, when the temperature of disks 4 is high (such as higher than 65° C.), the venting holes 5 are exposed; and when the temperature of disks 4 is low (such as below 55° C.), venting holes 5 are blocked.

For example, the second threshold temperature is higher than the first threshold temperature. For instance, the second threshold temperature can be arranged as 65° C. and the first threshold temperature can be arranged as 55° C. Depending on actual requirement and application environment, the first and second threshold temperatures can also be arranged as other numerical values.

As shown in FIGS. 1-2, according to an implementation of the present disclosure, a controller (not shown) is included, which is arranged to: in response to detecting that a temperature of a first disk 80 in a first row 8 of a plurality of rows 1 is above a third threshold temperature, block the venting holes 5 in the first row 8 corresponding to the disk 81 adjacent to the first disk 80 in the first disk 80. On the other hand, the controller can be further arranged to: in response to detecting that the temperature of the first disk 80 in the first row 8 of the plurality of rows 1 is above a fourth threshold temperature, block the venting holes 5 corresponding to the disks 90 in a second row 9 that flank the first disk 80, the second row 9 being adjacent to the first row 8.

In such an implementation, for example, the third threshold temperature can be equal to the fourth threshold temperature. As shown in FIG. 1, when the venting holes corresponding to the first disk 80 in the first row 8 are opened, it may be the case that the wind volume is small. To enlarge the wind volume, the venting holes of disks adjacent to the first disk 80 are blocked so as to enhance heat dissipation for the first disk 80. For example, as shown in FIG. 1, if the temperature of the first disk 80 in the first row 8 is detected to be higher than the third threshold temperature (such as 65° C.), then venting holes corresponding to disk 81 adjacent to the first disk 80 in the first row 8 can be blocked in order to enlarge volume of wind flowing through venting holes corresponding to the first disk 80, thereby enhancing heat dissipation for the first disk 80 and preventing damage to it.

As shown in FIG. 2, if the temperature of the first disk 80 in the first row 8 is detected to the higher than the fourth threshold temperature (such as 65° C.), then venting holes corresponding to disks 90 in the second row 9 flanking the first disk 80 and adjacent to the first row 8 can be blocked, which would also enable the volume of wind flowing through venting holes corresponding to the first disk 80 to increase accordingly, thereby enhancing heat dissipation to the first disk 80 and preventing damage to it. The two ways of enhancing heat dissipation shown in FIGS. 1 and 2 (used alternatively or simultaneously) can enhance heat dissipation for disks having high temperature risk, thereby preventing damage to it.

FIG. 6 illustrates a flow diagram of a method 300 for controlling venting holes according to the implementations of the present disclosure, wherein with respect to a heat dissipater 100 for storage 200 mentioned in FIGS. 1-5, a control flow diagram for venting holes 5 is shown.

At 302, temperature of disk 4 is detected. For example, as disks 4 take the form of a disk array, in some implementations, a temperature sensor can be used to detect the temperature of each disk.

At 304, it is determined whether the detected temperature of disk 4 is below the first threshold temperature. If it is, then at 306, venting holes 5 corresponding to disks 4 are blocked so that the magnetic winding is not electrically conducted when the temperature of the disk is low, such that the venting holes corresponding to the disk are blocked under the effect of the flyer's own gravity, thereby saving power.

For example, the first threshold temperature can be 55° C. or others. In an implementation, when it is determined that the detected temperature is below the first threshold temperature, the case is then counted. If the case that it is determined that the detected temperature is below the first threshold temperature occurs for M times successively (M=6, for instance), then venting holes 5 corresponding to the disk 4 (if the venting hole 5 opened before) are blocked at 306. If it does not happen for successive M times that the detected temperature is determined to be below the first threshold temperature (M=6, for instance), then after a delay of N seconds (N=10, for instance), it switches to 302 to continue detecting the temperature of disk 4.

On the other hand, if it is determined at 304 that the temperature of disk 4 is not below the first threshold temperature, then it is determined at 308 whether the temperature of the disk 4 is above a second threshold temperature. If it is, then at 310, venting holes corresponding to the disk 4 are opened so that the flyer is attracted by conducting the corresponding magnetic winding with electricity in order to expose the corresponding venting holes when the temperature of the disk is high, thereby enhancing heat dissipating effect and preventing the disk from being damaged under high temperature. If it is not, then it can switch to 302 (or switch to 302 after a delay) to continue to detect (or monitor) the temperature of disk 4.

For example, the second threshold temperature can be 65° C. or others. The second threshold temperature is, for example, larger than the first threshold temperature. In an implementation, when it is determined that the detected temperature is above the second threshold temperature, the case is counted. If the case that it is determined that the detected temperature is above the second threshold temperature occurs for P times successively (P=6, for instance), then venting holes 5 corresponding to the disk 4 (if the venting hole 5 blocked before) are opened at 310. If it does not happen for successive P times that the detected temperature is determined to be above the second threshold temperature (P=6, for instance), then after a delay of Q seconds (Q=10, for instance), it switches to 302 to continue detecting the temperature of disk 4.

The flow diagram of method 300 for controlling venting holes is only an example. It is appreciated by those skilled in the art that the operation of 304 and 308 can be switched.

In other words, in some implementations, it can be determined firstly whether the detected temperature is above the second threshold temperature. If it is, venting holes 5 corresponding to the disk 4 are opened. If it is not, it is determined again whether the detected temperature is below the first threshold temperature: if it is, venting holes 5 corresponding to the disk 4 are blocked; if it is not, switching to 302 to continue to detect the temperature of disk 4.

In an implementation, the method 300 for controlling venting holes according to the implementations of the present disclosure can further include (not shown): in response to detecting that a temperature of a first disk 80 in a first row 8 of the plurality of rows 1 is above a third threshold temperature, blocking the venting holes 5 corresponding to the disk 81 adjacent to the first disk 80 in the first row 8.

In another aspect, in response to detecting that the temperature of the first disk 80 in the first row 8 of the plurality of rows 1 is above a fourth threshold temperature, the venting holes corresponding to disk 90 in a second row 9 that flank the first disk 80 and adjacent to the first row 8 are blocked.

In such an implementation, for instance, the third threshold temperature can be equal to the fourth threshold temperature. As shown in FIG. 1, when the venting holes corresponding to the first disk 80 in the first row 8 are opened, it may be the case that the wind volume is small. To enlarge the wind volume, the venting holes of disks adjacent to the first disk 80 are blocked so as to enhance heat dissipation for the first disk 80. For example, if the temperature of the first disk 80 in the first row 8 is detected to be higher than the third threshold temperature (such as 65° C.), then venting holes corresponding to disk 81 adjacent to the first disk 80 in the first row 8 can be blocked in order to enlarge volume of wind flowing through venting holes corresponding to the first disk 80, thereby enhancing heat dissipation for the first disk 80 and preventing damage to it.

As shown in FIG. 2, if the temperature of the first disk 80 in the first row 8 is detected to the higher than the fourth threshold temperature (such as 65° C.), then venting holes corresponding to disks 90 in the second row 9 flanking the first disk 80 and adjacent to the first row 8 can be blocked, which would also enable the volume of wind flowing through venting holes corresponding to the first disk 80 to increase accordingly, thereby enhancing heat dissipation for the first disk 80 and preventing damage to it. The two ways of enhancing heat dissipation shown in FIGS. 1 and 2 (used alternatively or simultaneously) can enhance heat dissipation for disks having high temperature risk (for example, the first disk 80), thereby preventing damage to it.

Through the above depiction and the teaching given by the drawings, many modifications and other implementations of the present disclosure can be realized by those skilled in the art related to the present disclosure. Therefore, it is to be understood that the implementations of the present disclosure are not limited to the specific implementations disclosed herein; and the modifications and other implementations are intended to be included in the scope of the present disclosure. Furthermore, though the above depiction and associated drawings describe the example implementations under the context of some example combinations of components and/or functions, it is to be realized that alternative implementations provide different combinations of components and/or functions without departing from the scope of the present disclosure. In this respect, for example, other forms of combinations of components and/or functions different from those described explicitly above are also expected to be included in the scope of the present disclosure. Although specific terms are employed here, they are used in a general and descriptive sense rather than for limiting purpose.

We claim:

1. A heat dissipater (100) for a storage (200), the storage (200) comprising a drawer chassis (2), the drawer chassis (2) comprising at least one baffle (3) arranged in a direction perpendicular to a pulling direction (Y) of the drawer chassis (2) and accommodating disks (4) organized in a plurality of rows (1) and placed against the respective baffle, the heat dissipater (100) comprising:
   venting holes (5) arranged on the at least one baffle (3) and corresponding to the disks (4) placed against the respective baffle, respectively; and
   flyers (6) arranged on the at least one baffle (3) and corresponding to the venting holes (5), respectively, the flyers (6) being arranged to block the corresponding venting holes (5) and to expose the corresponding venting holes (5) in response to an attraction of a magnetic winding (7).

2. The heat dissipater (100) according to claim 1, wherein the venting holes (5) are rectangular holes arranged on the at least one baffle (3), profiles of the venting holes (5) being located within side profiles of the disks (4).

3. The heat dissipater (100) according to claim 1, wherein each of the flyers (6) has a first end moveably mounted on the respective baffle (3) and a second free end.

4. The heat dissipater (100) according to claim 1, wherein the magnetic winding (7) is arranged to attract the flyers (6) located on two opposite sides of the magnetic winding (7).

5. The heat dissipater (100) according to claim 1, wherein the flyers (6) comprise a first flyer (60) and a second flyer (61) parallel to each other, each of the first and second flyers (60, 61) being of a long strip form.

6. The heat dissipater (100) according to claim 5, wherein the first and second flyers (60, 61) cover at least a part of the corresponding venting holes (5) in case that the first and second flyers (60, 61) are folded.

7. The heat dissipater (100) according to claim 5, wherein the first and second flyers (60, 61) completely cover and block the venting holes (5) in case that the first and second flyers (60, 61) are folded.

8. The heat dissipater (100) according to claim 5, further comprising a controller configured to enable at least one of the venting holes (5) to be switched among the following states:
   a first state (S1) during which the first and second flyers (60, 61) are attracted by the magnetic winding (7) simultaneously and the at least one venting hole is completely exposed;
   a second state (S2) during which the first flyer (60) or the second flyer (61) is attracted by the magnetic winding (7) and a part of the at least one venting hole is exposed; and
   a third state (S3) during which the first and second flyers (60, 61) are not attracted by the magnetic winding (7) and the at least one venting hole is completely blocked.

9. The heat dissipater (100) according to claim 1, further comprising a controller configured to:
   in response to detecting that a temperature of the disks (4) is below a first threshold temperature, block the venting holes (5) corresponding to the disks (4); and
   in response to detecting that the temperature of the disks (4) is above a second threshold temperature, expose the venting holes (5) corresponding to the disks (4).

10. The heat dissipater (100) according to claim 9, wherein the second threshold temperature is higher than the first threshold temperature.

11. The heat dissipater (100) according to claim 1, further comprising a controller configured to:
   in response to detecting that a temperature of a first disk (80) in a first row (8) of the plurality of rows (1) is above a third threshold temperature, block the venting holes (5) corresponding to the disks (81) adjacent to the first disk (80) in the first row (8); and
   in response to detecting that the temperature of the first disk (80) in the first row (8) of the plurality of rows (1) is above a fourth threshold temperature, block the venting holes (5) corresponding to the disks (90) in a second row (9) that flank the first disk (80), the second row (9) being adjacent to the first row (8).

12. The heat dissipater (100) according to claim 11, wherein the third threshold temperature is equal to the fourth threshold temperature.

13. A storage (200), comprising
   a drawer chassis (2) comprising at least one baffle (3) arranged in a direction perpendicular to a pulling direction (Y) of the drawer chassis (2), the drawer chassis accommodating disks (4) organized in a plurality of rows (1) and placed against the respective baffle;
   a fan (10) accommodated inside the drawer chassis (2) and arranged closed to a distal end (21) of the drawer chassis (2), the fan (10) being arranged along a direction perpendicular to the pulling direction (Y) and generating a suction wind for dissipating heat for the disks (4); and
   a heat dissipater (100) for the storage (200) according to any of claims 1-12.

14. A method for controlling a heat dissipater (100) according to claim 1, comprising:
   in response to detecting that a temperature of the disks (4) corresponding to the venting holes (5) is below a first threshold temperature, blocking the venting holes (5); and
   in response to detecting that the temperature of the disks (4) corresponding to the venting holes (5) is above a second threshold temperature, exposing the venting holes (5).

15. The method according to claim 14, wherein the second threshold temperature is higher than the first threshold temperature.

16. The method according to claim 14, further comprising:
   in response to detecting that a temperature of a first disk (80) in a first row (8) of the plurality of rows (1) is above a third threshold temperature, blocking the venting holes corresponding to the disks (81) adjacent to the first disk (80) in the first row (8); and
   in response to detecting that the temperature of the first disk (80) in the first row (8) of the plurality of rows (1) is above a fourth threshold temperature, blocking the venting holes corresponding to the disks (90) in a second row (9) that flank the first disk (80), the second row (9) being adjacent to the first row (8).

17. The method according to claim 16, wherein the third threshold temperature is equal to the fourth temperature threshold.

* * * * *